United States Patent
Toyoyama et al.

(10) Patent No.: US 6,469,568 B2
(45) Date of Patent: Oct. 22, 2002

(54) METAL OXIDE SEMICONDUCTOR TRANSISTOR CIRCUIT AND SEMICONDUCTOR INTEGRATED CIRCUIT USING THE SAME

(75) Inventors: Shinji Toyoyama, Sakurai (JP); Yuichi Sato, Mie-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/742,369

(22) Filed: Dec. 22, 2000

(65) Prior Publication Data

US 2001/0006352 A1 Jul. 5, 2001

(30) Foreign Application Priority Data

Dec. 24, 1999 (JP) .............................. 11-366946

(51) Int. Cl.[7] ................................................. G05F 3/02
(52) U.S. Cl. ....................................... 327/534; 327/534
(58) Field of Search .............................. 327/534, 537, 327/545, 546

(56) References Cited

U.S. PATENT DOCUMENTS

| | | | | |
|---|---|---|---|---|
| 4,728,825 A | * | 3/1988 | Sugayama et al. | 327/534 |
| 5,748,016 A | * | 5/1998 | Kurosawa | 327/108 |
| 5,808,502 A | * | 9/1998 | Hui et al. | 327/333 |
| 5,880,620 A | * | 3/1999 | Gitlin et al. | 327/534 |
| 5,963,080 A | * | 10/1999 | Miske et al. | 327/534 |
| 6,052,019 A | * | 4/2000 | Kwong | 327/534 |
| 6,225,846 B1 | * | 5/2001 | Wada et al. | 327/534 |

FOREIGN PATENT DOCUMENTS

| | | |
|---|---|---|
| EP | 0872958 | 10/1998 |
| JP | 5-108194 | 4/1993 |
| JP | A786917 | 3/1995 |
| JP | B812917 | 2/1996 |
| JP | 10-294663 | 11/1998 |

* cited by examiner

Primary Examiner—Terry D. Cunningham

(57) ABSTRACT

A select circuit switches a connection from a gate terminal of an NMOS transistor or a substrate voltage terminal to a semiconductor substrate or well by a Select signal. At this time, a voltage of the substrate voltage terminal is set to be lower than a gate voltage in an OFF state. Consequently, when the semiconductor substrate or well is connected to the gate terminal in an active state, the off-current can be reduced to $10^{-10}$ A/$\mu$m. When the substrate voltage terminal is connected to the semiconductor substrate or well in a standby state, the off-current can be further reduced to $10^{-12}$ A/$\mu$m. Thus, leakage currents in the standby state and leakage currents flowing from the power supply voltage terminal to the ground voltage terminal in an active state can be suppressed.

1 Claim, 8 Drawing Sheets

METAL OXIDE SEMICONDUCTOR TRANSISTOR CIRCUIT AND SEMICONDUCTOR INTEGRATED CIRCUIT USING THE SAME

BACKGROUND OF THE INVENTION

The present invention relates to a MOS (Metal Oxide Semiconductor) transistor circuit and a semiconductor integrated circuit. The present invention relates, in particular, to a MOS transistor circuit and a semiconductor integrated circuit suitable for lower power consumption.

Along with the increased degree of integration of a large scale integrated circuit (LSI) and its higher-speed operation in recent years, there is a problem of higher LSI power consumption and thus power reduction is strongly required. Since the LSI power consumption is proportional to square of a power supply voltage, reducing the power supply voltage is effective to reduce power consumption. However, if only the power supply voltage is reduced, high-speed operation is disabled due to lower on-currents of a MOS transistor. To avoid this problem, the absolute value of the threshold voltage of the MOS transistor needs to be lowered as the power supply voltage is reduced. However, if the absolute value of the threshold voltage is lowered, the off-currents are increased by subthreshold currents of the MOS transistor.

Figure 6:
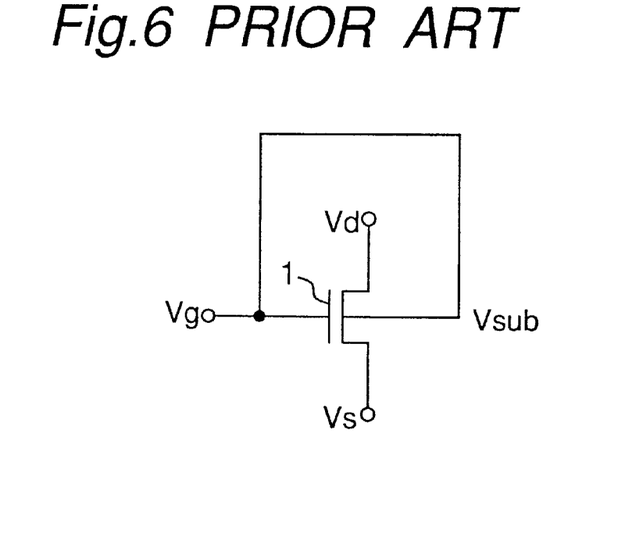
FIG. 6 is a circuit diagram of a conventional NMOS transistor circuit for reducing off-currents.

As disclosed in Japanese Patent Publication No. Hei 8-12917, a method of controlling the threshold voltage of the MOS transistor with the voltage of a gate terminal by connecting a semiconductor substrate or well with which the MOS transistor is formed to the gate terminal is proposed as a MOS transistor circuit for relieving the problem of increased off-currents. That is, the semiconductor substrate or well with which an NMOS transistor 1 is formed and the gate terminal of the NMOS transistor 1 are connected as shown in FIG. 6. When a voltage at which the NMOS transistor 1 is turned on (that is, a voltage which is positive relative to a source voltage Vs) is applied as a gate voltage Vg, the same voltage is applied to the semiconductor substrate or well. Therefore, the absolute value of the threshold voltage is equivalently reduced and thereby the on-current increases. On the other hand, when a voltage at which the NMOS transistor 1 is turned off (that is, a voltage which is equal or negative relative to the source voltage Vs) is applied as a gate voltage Vg, the same voltage is applied to the semiconductor substrate or well. Therefore, the absolute value of the threshold voltage is equivalently increased and thereby the off-current is reduced.

Figure 7:
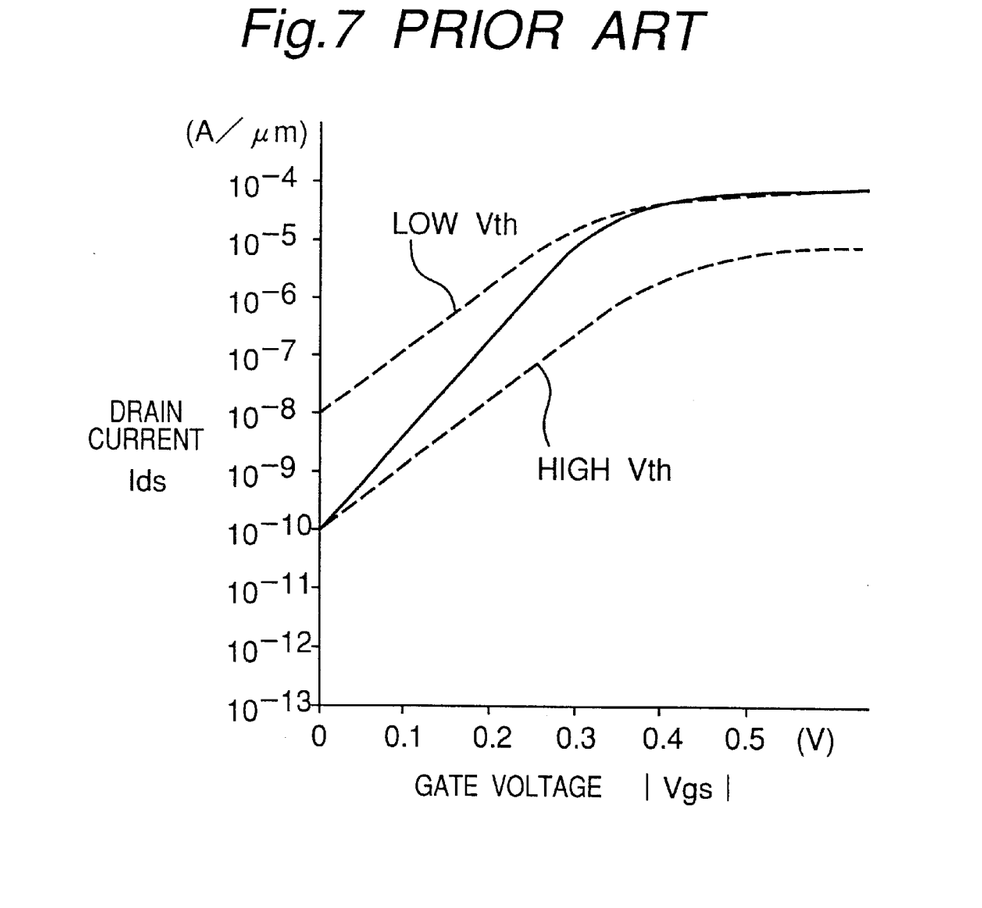
FIG. 7 shows the relationship between gate voltages and drain currents of the NMOS transistor in FIG. 6.

For example, the relationship between gate voltages Vgs of the NMOS transistor 1 and drain currents Ids can be set as shown in FIG. 7. The on-current can be increased to $10^{-4}$ A/$\mu$m, which is the same level as that of a usual MOS transistor having a low-threshold voltage, while the off-current can be reduced to $10^{-10}$ A/$\mu$m as in the case of a usual MOS transistor having a high-threshold voltage.

It is noted that, although an NMOS transistor is exemplified in FIG. 6, this configuration is also applicable to a PMOS transistor. That is, when a voltage at which a PMOS transistor is turned on (that is, a voltage which is negative relative to the source voltage Vs) is applied as a gate voltage Vg, the same voltage is applied to the semiconductor substrate or well with which the PMOS transistor is formed. Therefore, the absolute value of the threshold voltage is equivalently reduced and thereby the on-current increases. On the other hand, when a voltage at which the PMOS transistor is turned off (that is, a voltage which is equal or positive relative to the source voltage Vs) is applied as a gate voltage Vg, the same voltage is applied to the semiconductor substrate or well. Therefore, the absolute value of the threshold voltage is equivalently increased and thereby the off-current is reduced.

Figure 8:
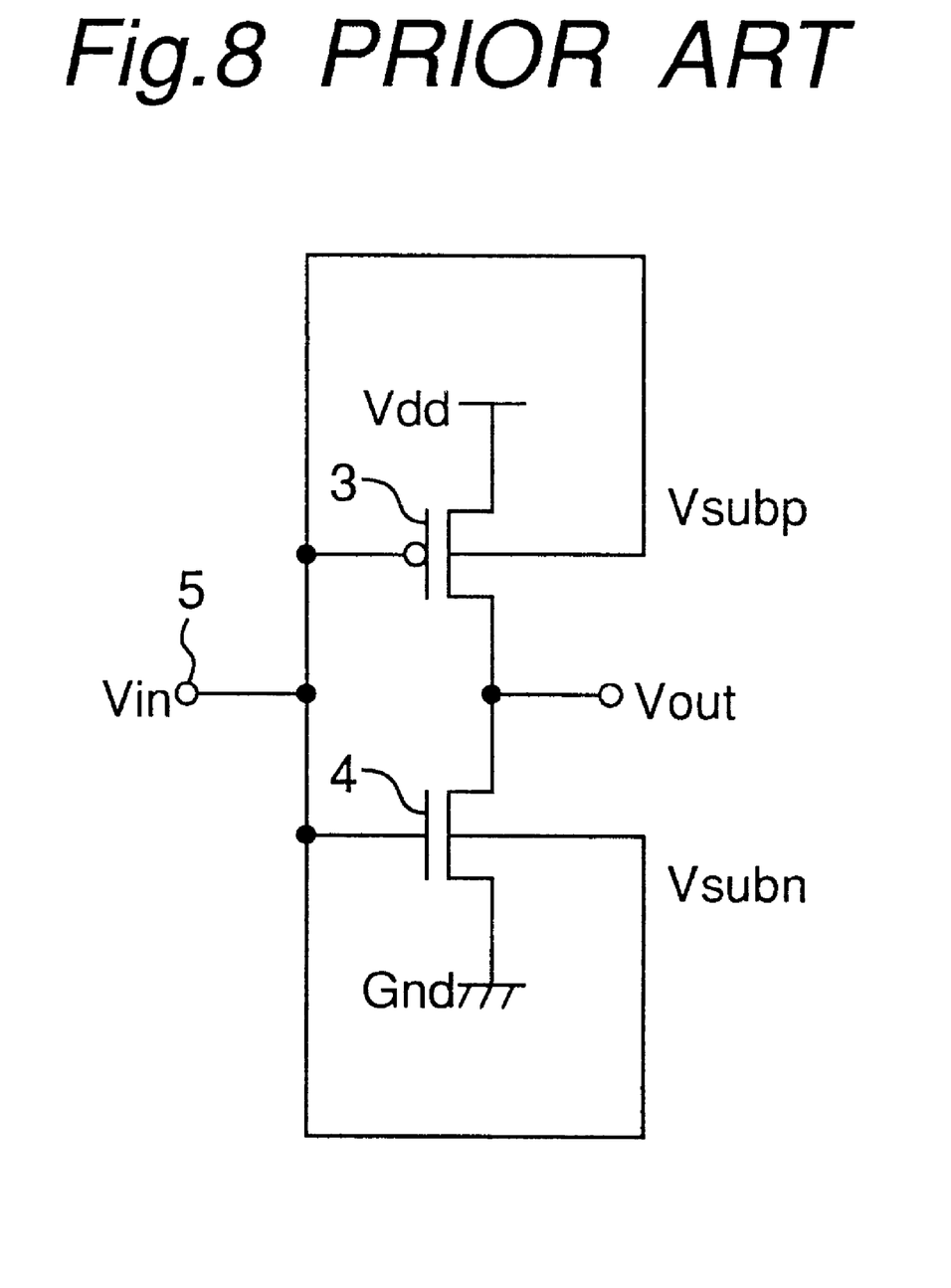
FIG. 8 is a circuit diagram of a CMOS inverter circuit constituted by using the MOS transistor circuit shown in FIG. 6.

A configuration shown in FIG. 8 is obtained when a CMOS (complementary metal oxide semiconductor) inverter circuit is constituted by using MOS transistors formed with a semiconductor substrate or well connected to a gate terminal as described above. To simplify the description below, it will be assumed that both a PMOS transistor 3 and an NMOS transistor 4 have characteristics shown in FIG. 7. The semiconductor substrate or well with which the PMOS transistor 3 and the NMOS transistor 4 are formed is connected to gate terminals of the PMOS transistor 3 and the NMOS transistor 4 (that is, an input terminal 5 of the CMOS inverter circuit). Voltages Vsubp, Vsubn of the semiconductor substrate or well are equal to the voltage Vin of the input terminal 5.

Therefore, since a turn-on voltage is applied to the PMOS transistor 3 when the voltage Vin of the input terminal 5 is equal to the ground voltage Gnd, the absolute value of the threshold voltage is equivalently lowered and the on-current is increased to $10^{-4}$ A/$\mu$m. Since a turn-off voltage is applied to the NMOS transistor 4 at the same time, the absolute value of the threshold voltage is equivalently increased and thereby the off-current is reduced to $10^{-10}$ A/$\mu$m. On the other hand, since a turn-off voltage is applied to the PMOS transistor 3 when the voltage Vin of the input terminal 5 is equal to the power supply voltage Vdd, the absolute value of the threshold voltage is equivalently increased and thereby the off-current is reduced to $10^{-10}$ A/$\mu$m. Since a turn-on voltage is applied to the NMOS transistor 4 at the same time, the absolute value of the threshold voltage is equivalently lowered and the on-current is increased to $10^{-4}$ A/$\mu$m. Thus, the on-current of the PMOS transistor 3 or the NMOS transistor 4 turned on becomes $10^{-4}$ A/$\mu$m and the driving current of the CMOS inverter circuit is increased to $10^{-4}$ A/$\mu$m. The off-current of the NMOS transistor 4 or the PMOS transistor 3 turned off becomes $10^{-10}$ A/$\mu$m and thereby the leakage current flowing from the power supply voltage terminal to the ground voltage terminal is reduced to $10^{-10}$ A/$\mu$m.

As disclosed in Japanese Patent Laid-Open Publication No. 5-108194 as another MOS transistor circuit for relieving the problem of increased off-current, it is proposed that LSI is in an active state that switching operation is performed or a standby state that switching operation is not performed and that the absolute value of the threshold voltage of a MOS transistor is set to be low in the active state and high in the standby state.

Figure 9:
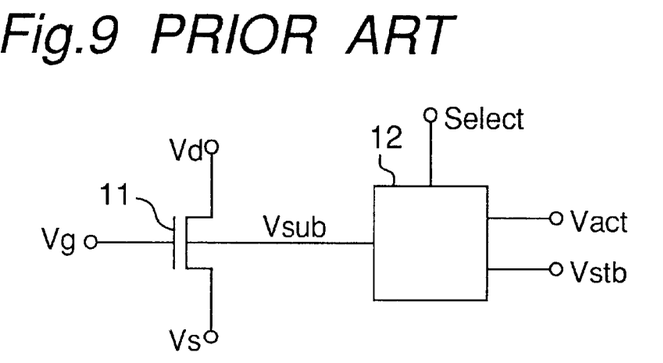
FIG. 9 is a circuit diagram of a MOS transistor circuit for reducing off-currents different from the one shown in FIG. 6.
Figure 10:
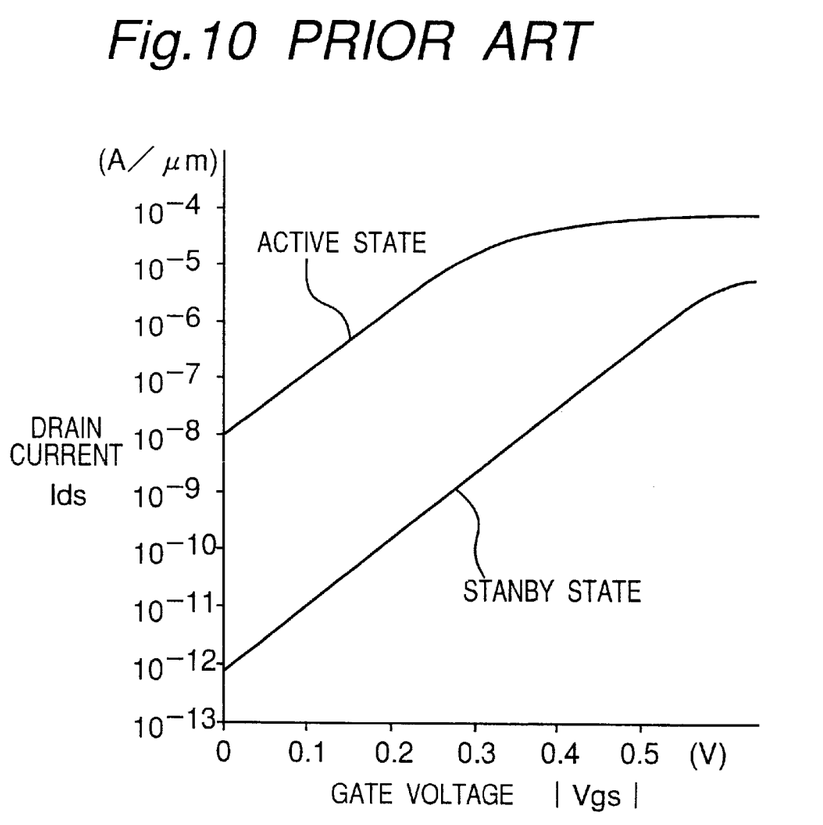
FIG. 10 shows the relationship between gate voltages and drain currents of the NMOS transistor in FIG. 9.

In this case, the threshold voltage is switched by switching the voltage Vsub of a semiconductor substrate or well with which an NMOS transistor 11 is formed as shown in FIG. 9. 12 denotes a select circuit. Vact is selected by a Select signal in an active state while Vstb is selected and outputted as Vsub in a standby state. In this case, if the voltage Vact and the voltage Vstb are set as Vact>Vstb, the absolute value of the threshold voltage of the NMOS transistor 11 is higher when the voltage Vstb is applied as Vsub than when voltage Vact is applied. By doing this, for example, the relationship between gate voltages Vgs and drain currents Ids of the NMOS transistor 11 can be set as shown in FIG. 10. The on-current in the active state can be increased to $10^{-4}$ A/$\mu$m while the off-current in the standby state can be reduced to $10^{-12}$ A/$\mu$m.

It is noted that, although an NMOS transistor is exemplified in FIG. 9, but this configuration is also applicable to a PMOS transistor. That is, in the case of a PMOS transistor, if the voltage Vact and the voltage Vstb are set as Vact<Vstb, the absolute value of the threshold voltage of the PMOS transistor 11 is higher when the voltage Vstb is applied as the voltage Vsub of the semiconductor substrate or well than when the voltage Vact is applied.

Figure 11:
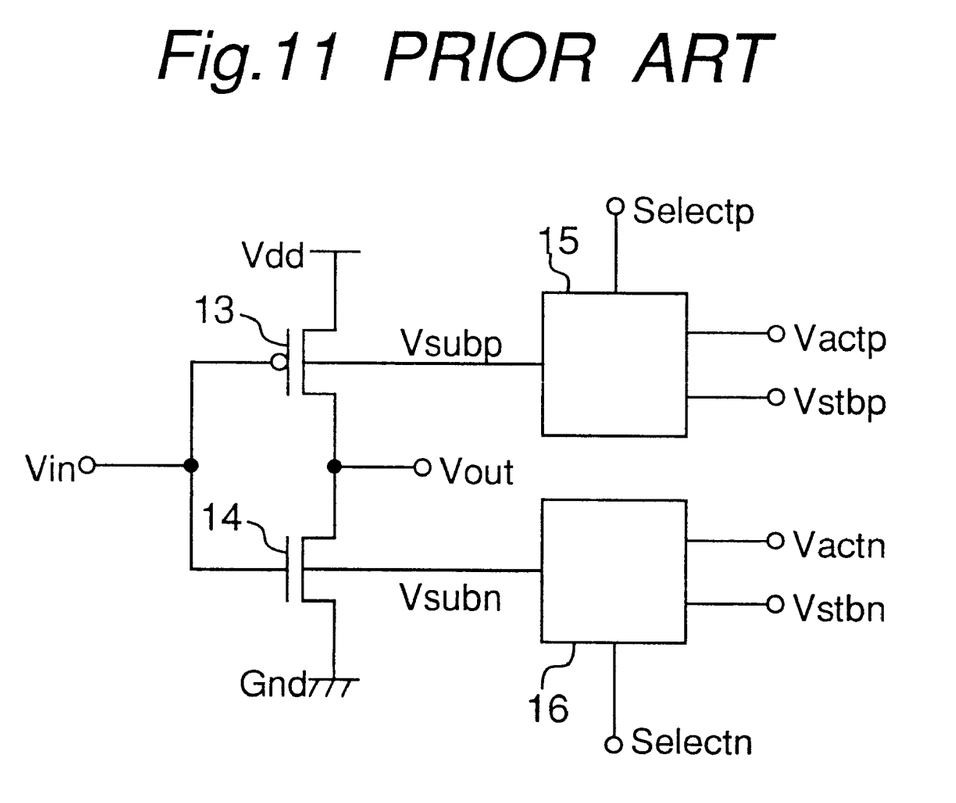
FIG. 11 is a circuit diagram of a CMOS inverter circuit constituted by using the MOS transistor circuit shown in FIG. 9.

The configuration shown in FIG. 11 is obtained when a CMOS (complementary metal oxide semiconductor) inverter circuit is constituted by using MOS transistors capable of switching voltages of a semiconductor substrate or well as described above. To simplify the description below, it will be assumed that both a PMOS transistor 13 and an NMOS transistor 14 have characteristics shown in FIG. 10. The threshold voltages of the PMOS transistor 13 and the NMOS transistor 14 are switched by switching the voltages Vsubp, Vsubn of the semiconductor substrate or well with which the PMOS transistor 3 and the NMOS transistor 4 are formed. Select circuits 15, 16 select Vactp, Vactn by a Selectp signal and Selectn signal, respectively, in an active state or Vstbp and Vstbn in a standby state so as to be outputted as the voltages Vsubp, Vsubn of the semiconductor substrate or well. In this case, if the voltages Vactp, Vstbp, Vactn and Vstbn are set as Vactp<Vstbp and Vactn>Vstbn, the absolute values of the threshold voltages of the PMOS transistor 13 and the NMOS transistor 14 are lowered in the active state. Therefore, the on-current of the PMOS transistor 13 or the NMOS transistor 14 turned on becomes $10^{-4}$ A/$\mu$m and the driving current of the CMOS inverter circuit is increased to $10^{-4}$ A/$\mu$m. On the other hand, the absolute values of the threshold voltages of the PMOS transistor 13 and the NMOS transistor 14 are increased in the standby state. Therefore, the off-current of the NMOS transistor 14 or the PMOS transistor 13 turned off becomes $10^{-12}$ A/$\mu$m and thereby the leakage current flowing from the power supply voltage terminal to the ground voltage terminal is reduced to $10^{-12}$ A/$\mu$m.

However, there are problems described below with the above-described conventional MOS transistor circuit where the semiconductor substrate or well is connected to the gate terminal (hereinafter, referred to as a first conventional circuit) and the MOS transistors capable of switching voltages of the semiconductor substrate or well (hereinafter, referred to as a second conventional circuit).

That is, a first conventional circuit having a structure shown in FIG. 6 increases the on-current while reducing the off-current. The off-current is $10^{-10}$ A/$\mu$m as shown in FIG. 7. This is higher than $10^{-12}$ A/$\mu$m, which is the off-current in a standby state in a second conventional circuit (FIG. 10). Since the first conventional circuit cannot sufficiently suppress leakage currents in the standby state, this circuit cannot be used for equipment such as a mobile phone, a hand-held terminal or the like where leakage currents in the standby state need to be suppressed.

The second conventional circuit having a structure shown in FIG. 9 reduces only leakage currents in the standby state. Although the off-current in the standby state is as low as $10^{-12}$ A/$\mu$m as shown in FIG. 10, the off-current in the active state is as high as $10^{-8}$ A/$\mu$m. Therefore, when a CMOS circuit such as a CMOS inverter circuit shown FIG. 11 or the like is constituted, there is a problem that leakage currents from the power supply voltage terminal to the ground voltage terminal in the active state become very high. Particularly, if the power supply voltage is reduced along with further miniaturization, leakage currents increase in response to discharge/charge currents. Power consumption increased by the leakage currents in the active state becomes a serious problem.

SUMMARY OF THE INVENTION

Accordingly, an object of the present invention is to provide a semiconductor integrated circuit which can increase on-currents and reduce off-currents in an active state and further reduce the off-currents in the standby state or a semiconductor integrated circuit which can increase on-currents and reduce off-currents regardless of whether the circuit is in the active state or the standby state.

In order to achieve the above object, there is provided a MOS transistor circuit comprising: switching means for electrically switching a connection of a semiconductor substrate or well with which a MOS transistor is formed to either a gate terminal of the MOS transistor or a substrate voltage terminal for the semiconductor substrate or well.

According to the above constitution, connections of the semiconductor substrate or well with which the MOS transistor is formed are electrically switched between the gate terminal of the MOS transistor and the substrate voltage terminal for the semiconductor substrate or well by the switching means. Thus, the threshold voltage of the MOS transistor is controlled by both the voltage of the gate terminal and the voltage of the substrate voltage terminal. Therefore, the on-current can be increased and the off-current can be reduced by setting the voltage of the gate terminal and the substrate voltage terminal properly.

In one embodiment of the present invention, when the MOS transistor is a first MOS transistor, the switching means are constituted by: a second MOS transistor whose source and drain terminals are connected to the semiconductor substrate or well and a gate terminal, and a third MOS transistor whose source and drain terminals are connected to the semiconductor substrate or well and a substrate voltage terminal.

According to the above constitution, when the second MOS transistor is turned on, the semiconductor substrate or well is connected to the gate terminal and the threshold voltage of the MOS transistor is controlled by the voltage of the gate terminal. On the other hand, when the third MOS transistor is turned on, the semiconductor substrate or well is connected to the substrate voltage terminal and the threshold voltage of the MOS transistor is controlled by the voltage of the substrate voltage terminal. By controlling an ON/OFF state of the second and third MOS transistors, a medium for controlling the threshold voltages of the MOS transistors can be switched between the voltage of the gate terminal and the voltage of the substrate voltage terminal. Thus, the configuration of the switching means can be simplified to prevent the increase in the circuit scale.

In one embodiment of the present invention, the MOS transistor connected to a terminal having a lower potential out of the gate terminal and the substrate voltage terminal out of the second MOS transistor and the third MOS transistor is an n-type MOS transistor, and the MOS transistor connected to a terminal having a higher potential out of the gate terminal and the substrate voltage terminal out of the second MOS transistor and the third MOS transistor is a p-type MOS transistor.

According to the above constitution, there is no voltage increase or voltage drop by the threshold voltages of the second MOS transistor and the third MOS transistor constituting the switching means. Therefore, the voltage of the substrate or well of the first MOS transistor becomes equal to the voltage of the gate terminal or the substrate voltage terminal. Therefore, the threshold voltage of the first MOS transistor can be efficiently controlled.

In one embodiment of the present invention, the switching means switches a connection in response to a switching signal, and the gate terminal of the second MOS transistor and the gate terminal of the third MOS transistor are connected to a switching signal input terminal for the switching signal.

According to the above constitution, ON/OFF states of the second MOS transistor and the third MOS transistor constituting the switching means are controlled by one switching signal from the switching signal input terminal.

In one embodiment of the present invention, the absolute value of the threshold voltage of the second MOS transistor and that of the third MOS transistor are higher than the absolute value of the threshold voltage of the first MOS transistor.

According to the above constitution, even if a voltage higher than that of the first MOS transistor is applied to the second MOS transistor or the third MOS transistor constituting the switching means, leakage currents through the second MOS transistor and the third MOS transistor can be suppressed to a low level.

In one embodiment of the present invention, the switching means switches a connection in response to switching of the MOS transistor circuit between an active state and a standby state.

According to the above constitution, switching by the switching means is performed in response to switching between the active state and the standby state of the MOS transistor circuit. The absolute value of the threshold voltage of the first MOS transistor is set to be a voltage suitable for the active state or the standby state.

In one embodiment of the present invention, the switching means switches a connection so that the semiconductor substrate or well is electrically connected to the gate terminal in the active state while the semiconductor substrate or well is electrically connected to the substrate voltage terminal in the standby state.

According to the above constitution, the threshold voltage of the MOS transistor is controlled by the voltage of the gate terminal in the active state so that the on-current is increased and the off-current is reduced. On the other hand, the threshold voltage of the MOS transistor is controlled by the voltage of the substrate voltage terminal in the standby state. The off-current can be controlled by the voltage of the substrate voltage terminal so as to be further reduced compared with that in the active state.

In one embodiment of the present invention, the switching means switches a connection in response to the change in a gate voltage of the MOS transistor.

According to the above constitution, switching of connections by the switching means is performed in response to the change in the gate voltage of the MOS transistor and the threshold voltage of the MOS transistor is set to be a voltage suitable as a gate voltage.

In one embodiment of the present invention, the switching means switches a connection so that the semiconductor substrate or well is electrically connected to the gate terminal when the gate voltage is a voltage at which the MOS transistor conducts while the semiconductor substrate or well is electrically connected to the substrate voltage terminal when the gate voltage is a voltage at which the MOS transistor does not conduct.

According to the above constitution, when the MOS transistor is conducting, the absolute value of the threshold voltage of the MOS transistor is controlled by the voltage of the gate terminal so as to be lowered and thereby the on-current is increased. On the other hand, when the MOS transistor is not conducting, the absolute value of the threshold voltage can be controlled by the voltage of the substrate voltage terminal so as to be increased.

In one embodiment of the present invention, the voltage of the substrate voltage terminal is a voltage at which the absolute value of the threshold voltage of the MOS transistor is increased when the semiconductor substrate or well is electrically connected to the substrate voltage terminal.

According to the above constitution, when the semiconductor substrate or well with which the MOS transistor is formed is electrically connected to the substrate voltage terminal, the absolute value of the threshold voltage of the MOS transistor is increased. Therefore, the off-current is reduced by connecting the substrate or well to the substrate voltage terminal in a standby state or a non-conductive state.

Also, there is provided a CMOS logic circuit using the MOS transistor circuit comprising: a first MOS transistor circuit where the MOS transistor is a p-type MOS transistor, and a second MOS transistor circuit where the MOS transistor is an n-type MOS transistor.

According to the above constitution, when the semiconductor substrate or well with which the PMOS transistor of the first MOS transistor circuit and the NMOS transistor of the second MOS transistor circuit are formed is connected to the gate terminals in the active state while connected to the substrate voltage terminals in the standby state, the driving current is increased and leakage currents are reduced in the active state and leakage currents can be further reduced in the standby state. When either the semiconductor substrate or well of the PMOS transistor or the semiconductor substrate or well of the NMOS transistor is connected to the gate terminal and the other is connected to the substrate voltage terminal, the driving current can be increased while leakage currents are reduced regardless of whether the circuit is in the active state or the standby state.

In one embodiment of the present invention, the semiconductor substrate or well with which the p-type MOS transistor constituting first switching means, which is means for switching the first MOS transistor circuit, is formed is connected to a first substrate voltage terminal, which is a substrate voltage terminal of the first MOS transistor circuit, while the semiconductor substrate or well with which the n-type MOS transistor constituting the first switching means is formed is connected to a ground voltage terminal, and the semiconductor substrate or well with which the p-type MOS transistor constituting second switching means, which is means for switching the second MOS transistor circuit, is formed is connected to a power supply voltage terminal while the semiconductor substrate or well with which the n-type MOS transistor constituting the second switching means is formed is connected to a second substrate voltage terminal, which is a substrate voltage terminal of the second MOS transistor circuit.

According to the above constitution, the voltage of the substrate or well of respective PMOS transistors constituting the first switching means for the first MOS transistor circuit and the second switching means for the second MOS transistor circuit becomes equal to the voltage of the source terminal or higher while the voltage of the substrate or well of respective NMOS transistors constituting the two switching means becomes equal to the voltage of the source terminal or lower. Thus, the absolute value of the threshold voltages of the PMOS transistor and the NMOS transistor constituting the two switching means are increased and thereby the leakage currents through the respective MOS transistors constituting the two switching means can be suppressed to a low level.

In one embodiment of the present invention, the semiconductor substrate or well with which the p-type MOS transistor constituting the first switching means, which is means for switching the first MOS transistor circuit is formed is connected to the first substrate voltage terminal, which is a substrate voltage terminal of the first MOS transistor circuit, while the semiconductor substrate or well with which the n-type MOS transistor constituting the first switching means is formed is connected to the second substrate voltage terminal, which is a substrate voltage terminal of the second MOS transistor circuit, and the semiconductor substrate or well with which the p-type MOS transistor constituting the second switching means, which is means for switching the second MOS transistor circuit, is formed is connected to the first substrate voltage terminal while the semiconductor substrate or well with which the n-type MOS transistor constituting the second switching means is formed is connected to the second substrate voltage terminal.

According to the above constitution, the voltage of the substrate or well of the NMOS transistor constituting the first switching means is made lower than in the case of being connected to the ground voltage terminal. Further, the voltage of the substrate or well of the PMOS transistor constituting the second switching means is made higher than in the case of being connected to the power supply voltage terminal. Thus, the absolute value of the threshold voltage of the respective MOS transistors constituting the two switching means is further increased and thereby the leakage currents through the respective MOS transistors are further reduced.

In one embodiment of the present invention, a first switching signal input terminal, which is a switching signal input terminal for the first MOS transistor circuit, and a second switching signal input terminal, which is a switching signal input terminal for the second MOS transistor circuit, are connected.

According to the above constitution, switching connections of the first switching means for the first MOS transistor circuit and the second switching means for the second MOS transistor circuit is controlled by one switching signal.

In one embodiment of the present invention, the switching signal is generated by a p-type MOS transistor where source and drain terminals thereof are connected to the first switching signal input terminal and the second switching signal input terminal and the first substrate voltage terminal, which is a substrate voltage terminal of the first MOS transistor circuit, while a gate terminals is connected to an input terminal of the CMOS logic circuit and an n-type MOS transistor where source and drain terminals are connected to the first switching signal input terminal and the second switching signal input terminal and the second substrate voltage terminal, which is a substrate voltage terminal of the second MOS transistor circuit, while a gate terminal is connected to the input terminal of the CMOS logic circuit.

According to the above constitution, there is no voltage increase or voltage drop by the threshold voltages of the PMOS transistor and the NMOS transistor generating the switching signal. Thus, the voltage of the switching signal becomes equal to the voltage of the first substrate voltage terminal of the first MOS transistor circuit or the voltage of the second substrate voltage terminal of the second MOS transistor circuit.

In one embodiment of the present invention, the absolute value of the threshold voltage of the p-type MOS transistors generating the switching signal is set to be higher than the difference between a voltage of the first substrate voltage terminal and a voltage of the power supply voltage terminal and lower than the difference between a voltage of the first substrate voltage terminal and a voltage of the ground voltage terminal, and the absolute value of the threshold voltage of the n-type MOS transistor generating the switching signal is set to be higher than the difference between a voltage of the second substrate voltage terminal and a voltage of the ground voltage terminal and lower than the difference between a voltage of the second substrate voltage terminal and a voltage of the power supply voltage terminal.

According to the above constitution, when the voltage of the input terminal of the CMOS logic circuit becomes equal to the power supply voltage, the PMOS transistor generating the switching signal is turned off while the NMOS transistor is turned on. Thus, the switching signal becomes equal to the voltage of the second substrate voltage terminal. When the voltage of the input terminal becomes equal to the ground voltage, the PMOS transistor is turned on while the NMOS transistor is turned off. Thus, the switching signal becomes equal to the voltage of the first substrate voltage terminal.

In one embodiment of the present invention, the semiconductor substrate or well with which the p-type MOS transistor generating the switching signal is formed is connected to the first substrate voltage terminal, and the semiconductor substrate or well with which the n-type MOS transistor generating the switching signal is formed is connected to the second substrate voltage terminal.

According to the above constitution, the voltage of the substrate or well of the PMOS transistor and the NMOS transistor generating the switching signal becomes equal to the voltage of the source terminal. Therefore, the absolute values of the threshold voltages of the PMOS transistor and the NMOS transistor increase and thereby leakage currents through these MOS transistors are suppressed.

Also, there is provided a latching circuit comprising the CMOS logic circuit.

According to the above constitution, since the CMOS logic circuit constituted by the MOS transistor circuit according to the first aspect of the invention is provided, connections of the semiconductor substrate or well of the MOS transistor constituting the MOS transistor circuit are switched between the gate terminal and the substrate voltage terminal so that leakage currents of the latching circuit are suppressed and thereby lower power consumption is achieved.

Also, there is provided a flip-flop comprising the CMOS logic circuit.

According to the above constitution, since the CMOS logic circuit constituted by the MOS transistor circuit according to the first aspect of the invention is provided, connections of the semiconductor substrate or well of the MOS transistor constituting the MOS transistor circuit are switched between the gate terminal and the substrate voltage terminal so that leakage currents of the flip-flop are suppressed and thereby lower power consumption is achieved.

In one embodiment of the present invention, the CMOS logic circuit is used in the configuration of either the master-stage latching circuit or slave-stage latching circuit.

According to the above constitution, out of the master-stage latching circuit and the slave-stage latching circuit, leakage currents of the one using the CMOS logic circuit are suppressed and thereby lower power consumption is achieved.

Also, there is provided a data storage circuit for once storing data of an operation stopping circuit when power supply is stopped to the operation stopping circuit, wherein the latching circuit is included in the configuration.

According to the above constitution, since the latching circuit or the flip-flop provided with the CMOS logic circuit constituted by the MOS transistor circuit according to the first aspect of the invention is included, leakage currents of the data storage circuit are suppressed and thereby lower power consumption is achieved.

In one embodiment of the present invention, there is provided power supply stopping means for stopping power supply to a latching circuit not using the CMOS logic circuit out of a master-stage latching circuit and a slave-stage latching circuit constituting the flip-flop when power supply is stopped to the operation stopping circuit.

According to the above constitution, out of the master-stage latching circuit and the slave-stage latching circuit constituting the flip-flop, the power supply stopping means stops power supply to the latching circuit which does not include a CMOS logic circuit according to the second aspect of the invention. In this case, leakage currents are suppressed by operation of the MOS transistor circuit according to the first aspect of the invention in the latching circuit which includes the CMOS logic circuit. Thus, leakage currents in the data storage circuit when power supply is stopped are suppressed and thereby lower power consumption is achieved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
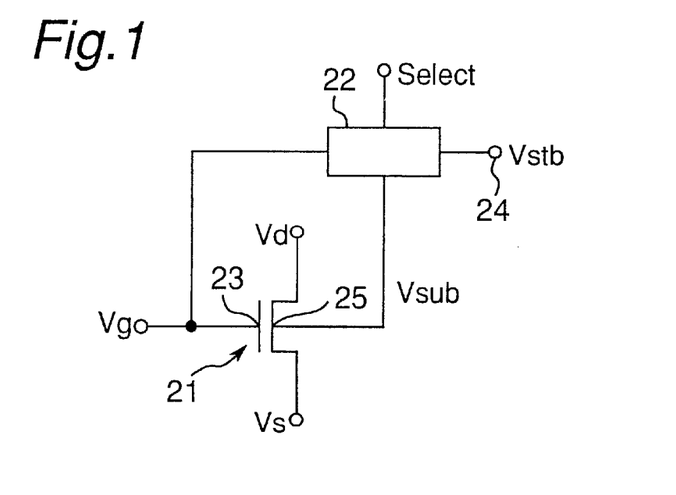
FIG. 1 is a circuit diagram of a MOS transistor circuit according to the present invention.

The present invention will be described in detail below with reference to embodiments shown in the drawings. FIG. 1 is a circuit diagram of a MOS transistor circuit according to this embodiment. In FIG. 1, 21 denotes an NMOS transistor. 22 denotes a select circuit. The select circuit 22 selects by a Select signal either a gate terminal 23 of the NMOS transistor 21 or a substrate voltage terminal 24 for a semiconductor substrate or well with which the NMOS transistor 21 is formed so as to be electrically connected to the semiconductor substrate or well 25. That is, the voltage Vg of the gate terminal 23 of the NMOS transistor 21 or the voltage Vstb of the substrate voltage terminal 24 is applied as the voltage Vsub of the semiconductor substrate or well 25.

Figure 2:
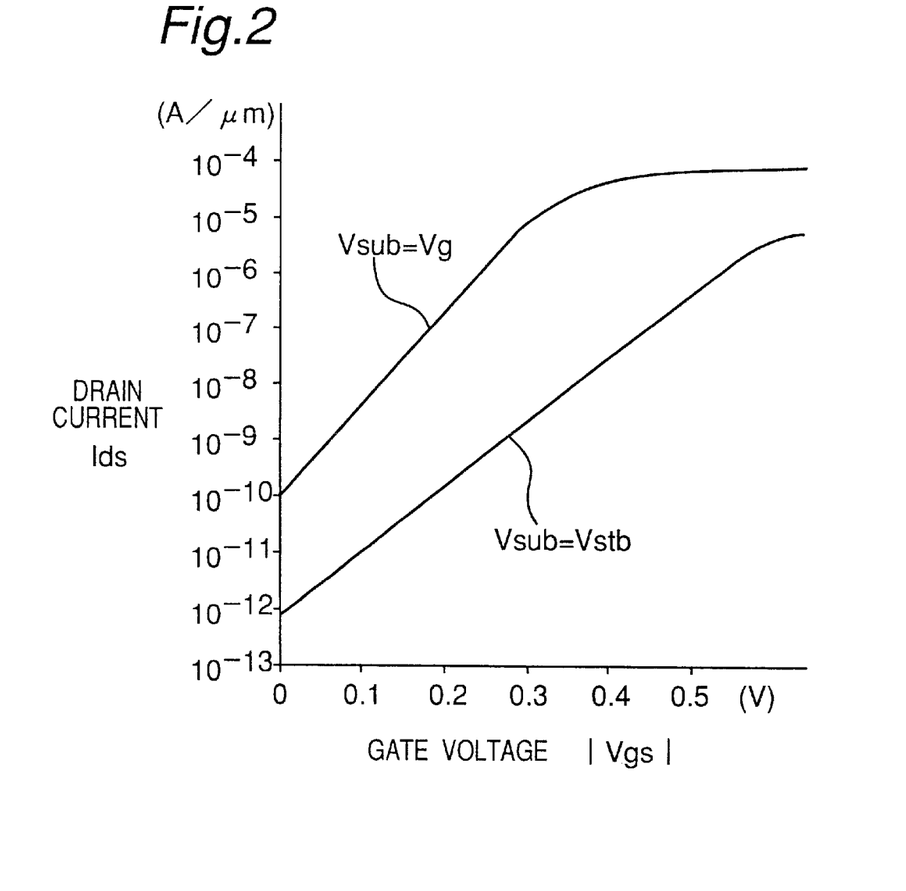
FIG. 2 shows the relationship between gate voltages and drain currents of the NMOS transistor in FIG. 1.

When a voltage at which the NMOS transistor 21 is turned on (that is, a voltage which is positive relative to the source voltage Vs) is applied as the gate voltage Vg while the semiconductor substrate or well 25 is connected to the gate terminal 23, the absolute value of the threshold voltage is equivalently lowered and the on-current is increased since the same voltage is applied to the semiconductor substrate or well 25. On the other hand, when a voltage at which the NMOS transistor 21 is turned off (that is, a voltage which is equal or negative relative to the source voltage Vs) is applied as the gate voltage Vg, the absolute value of the threshold voltage is equivalently increased and the off-current is reduced since the same voltage is applied to the semiconductor substrate or well 25. For example, the relationship between the gate voltage Vgs of the NMOS transistor 21 and the drain current Ids can be made like characteristics obtained when Vsub=Vg in FIG. 2. As in the case of the first conventional circuit shown in FIG. 7, the on-current is increased to $10^{-4}$ A/$\mu$m while the off-current can be reduced to $10^{-10}$ A/$\mu$m.

On the other hand, when the semiconductor substrate or well 25 is connected to the substrate voltage terminal 24, the threshold voltage of the NMOS transistor 21 can be controlled by the voltage Vstb of the substrate voltage terminal 24. That is, when Vstb is set to be lower than the gate voltage Vg at which the NMOS transistor 21 is turned off, the absolute value of the threshold voltage of the NMOS transistor 21 is larger when Vstb is applied as Vsub than when the voltage Vg is applied. For example, the relationship between the gate voltage Vgs and the drain current Ids of the NMOS transistor 21 can be made like characteristics obtained when Vsub=Vstb in FIG. 2. As in the case of the second conventional circuit shown in FIG. 10, the off-current can be reduced to $10^{-12}$ A/$\mu$m.

It is noted that, although an NMOS transistor is exemplified in FIG. 1, this configuration is also applicable to a PMOS transistor. That is, in the case of a PMOS transistor, when a voltage at which the PMOS transistor is turned on (that is, a voltage which is negative relative to the source voltage Vs) is applied as the gate voltage Vg while the semiconductor substrate or well with which the PMOS transistor is formed is connected to the gate terminal, the same voltage is applied to the semiconductor substrate or well. Therefore, the absolute value of the threshold voltage is equivalently lowered and the on-current increases. On the other hand, when a voltage at which the PMOS transistor is turned off (that is, a voltage which is equal or positive relative to the source voltage Vs) is applied as the gate voltage Vg, the same voltage is applied to the semiconductor substrate or well. Therefore, the absolute value of the threshold voltage is equivalently increased and the off-current is reduced. On the other hand, when Vstb is set to be higher than a gate voltage Vg at which the PMOS transistor is turned off while the semiconductor substrate or well is connected to the substrate voltage terminal for the semiconductor substrate or well, the absolute value of the threshold voltage of the PMOS transistor becomes higher when Vstb is applied as Vsub than when the voltage Vg is applied.

Figure 3:
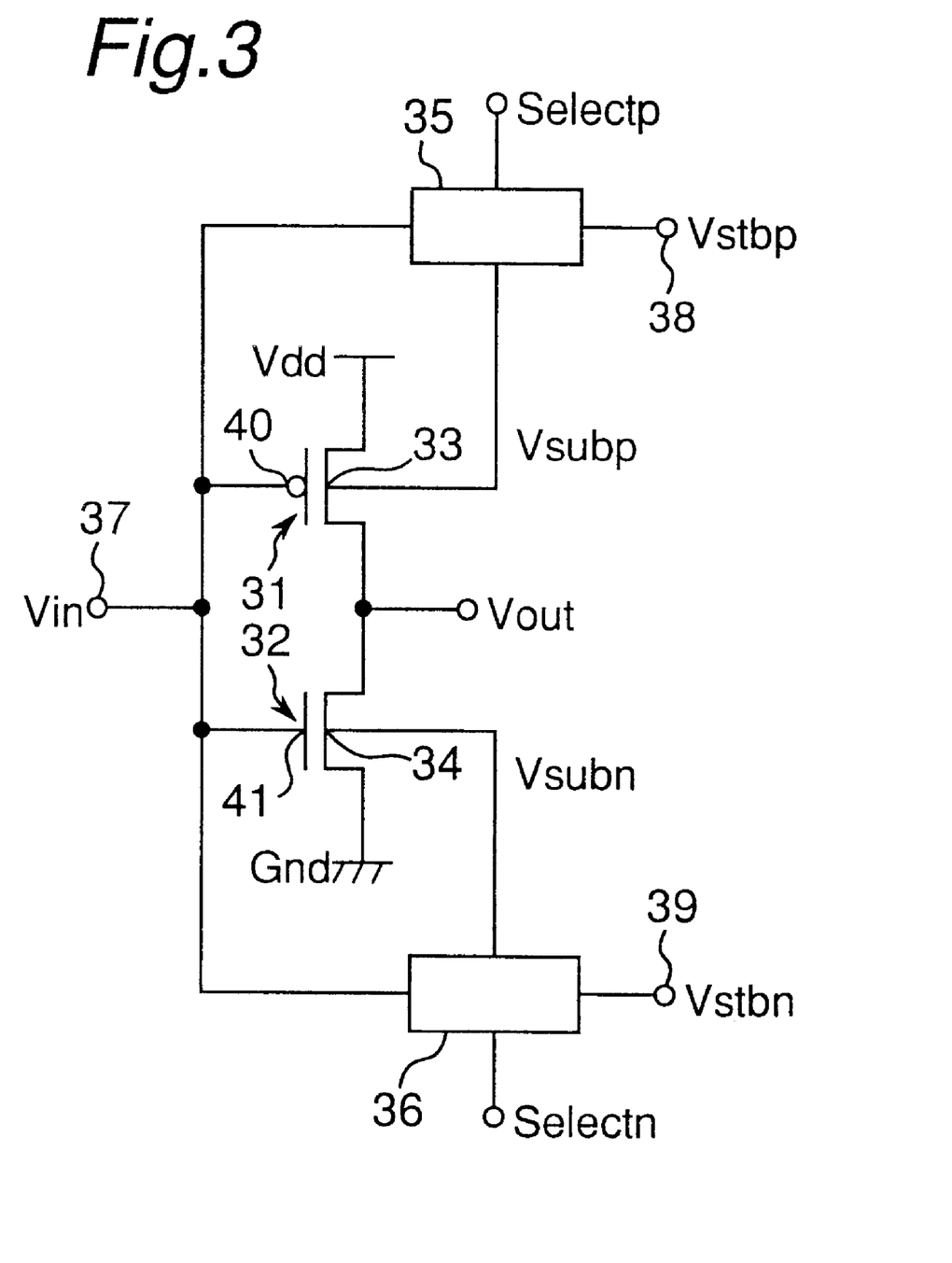
FIG. 3 is a circuit diagram of a CMOS inverter circuit constituted by using the MOS transistor circuit shown in FIG. 1.

When a CMOS inverter circuit is constituted by using a MOS transistor capable of switching connections of the above-described semiconductor substrate or well between the gate terminal and the substrate voltage terminal, the configuration shown in FIG. 3 is obtained. To simplify the description below, it will be assumed that both the PMOS transistor 31 and the NMOS transistor 32 have characteristics shown in FIG. 2. The threshold values of the PMOS transistor 31 and the NMOS transistor 32 are switched by switching voltages Vsubp, Vsubn of the semiconductor substrate or well 33, 34 with which the PMOS transistor 31 and the NMOS transistor 32 are formed. Respective select circuits 35, 36 select either the voltage Vin of the input terminal 37 or the voltages Vstbp, Vstbn of the substrate voltage terminal 38, 39 by a Selectp signal or a Selectn signal so as to be outputted as the voltages Vsubp, Vsubn of the semiconductor substrate or well 33, 34.

As a first method of operating a CMOS inverter circuit shown in FIG. 3, described below is a method of switching both a semiconductor substrate or well 33 with which a PMOS transistor 31 is formed and a semiconductor substrate or well 34 with which an NMOS transistor 32 is formed between the input terminal 37 of the CMOS inverter circuit and the substrate voltage terminals 38, 39.

First described is the case where the semiconductor substrate or well 33, 34 with which the PMOS transistor 31 and the NMOS transistor 32 are formed is connected to the gate terminals 40, 41 (that is, the input terminal 37 of a CMOS inverter circuit) of the PMOS transistor 31 and the NMOS transistor 32. Since a turn-on voltage is applied to the PMOS transistor 31 when the voltage Vin of the input terminal 37 is equal to the ground voltage Gnd, the absolute value of the threshold voltage is equivalently lowered and thereby the on-current is increased to $10^{-4}$ A/$\mu$m. Since a turn-off voltage is applied to the NMOS transistor 32 at the same time, the absolute value of the threshold voltage is equivalently increased and thereby the off-current is reduced to $10^{-10}$ A/$\mu$m. On the other hand, since a turn-off voltage is applied to the PMOS transistor 31 when the voltage Vin of the input terminal 37 is equal to the power supply voltage Vdd, the absolute value of the threshold voltage is equivalently increased and the off-current is reduced to $10^{-10}$ A/$\mu$m. Since turn-on voltage is applied to the NMOS transistor 32 at the same time, the absolute value of the threshold voltage is equivalently lowered and the on-current is increased to $10^{-4}$ A/$\mu$m. As described above, the on-current of the PMOS transistor 31 or NMOS transistor 32 turned on becomes $10^{-4}$ A/$\mu$m and the driving current of the CMOS inverter circuit is increased to $10^{-4}$ A/$\mu$m. The off-current of the NMOS transistor 32 or the PMOS transistor 31 turned off becomes $10^{-10}$ A/$\mu$m and thereby the leakage current flowing from the power supply voltage terminal to the ground voltage terminal is reduced to $10^{-10}$ A/$\mu$m.

Described below is the case where semiconductor substrate or well 33 with which the PMOS transistor 31 is formed is connected to the substrate voltage terminal 38 and the semiconductor substrate or well 34 with which the NMOS transistor 32 is formed is connected to the substrate voltage terminal 39. In this case, the threshold voltages of the PMOS transistor 31 and the NMOS transistor 32 can be controlled by voltages Vstbp, Vstbn of the substrate voltage terminals 38, 39. That is, when the voltage Vstbp and the voltage Vstbn are set as Vstbp>Vdd>Gnd>Vstbn, the absolute value of the threshold voltages of the PMOS transistor 31 and the NMOS transistor 32 can be made higher than when the semiconductor substrates or well 33, 34 is connected to the input terminal 37 of the CMOS inverter circuit. Therefore, the off-current of the PMOS transistor 31 or the NMOS transistor 32 turned off becomes $10^{-12}$ A/$\mu$m and thereby the leakage current flowing from the power supply voltage terminal to the ground voltage terminal is further reduced to $10^{-12}$ A/$\mu$m.

Figure 4:
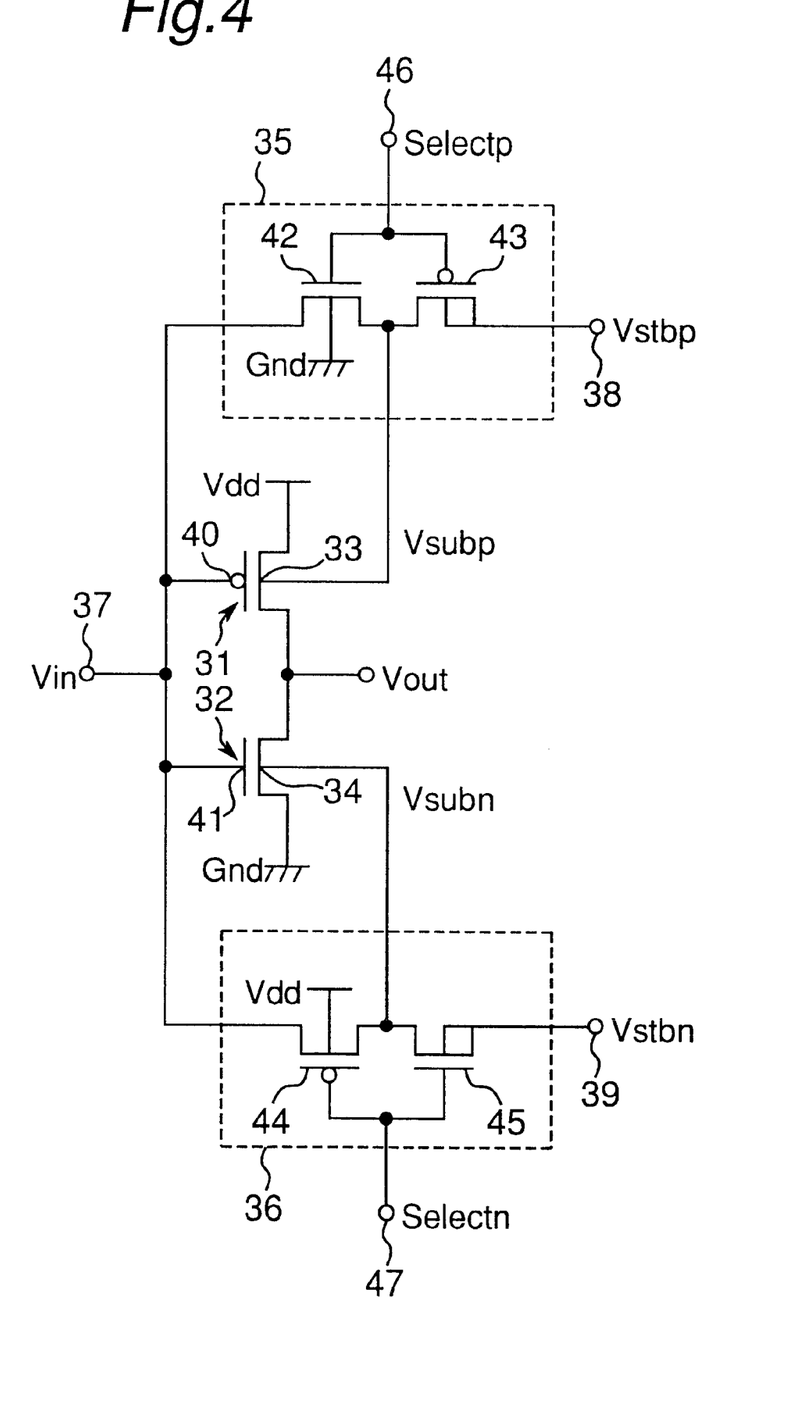
FIG. 4 is a detailed circuit diagram of the select circuit in FIG. 3.

FIG. 4 is a detailed circuit diagram of the select circuits 35, 36. The select circuit 35 is constituted by an NMOS transistor 42 of which source and drain terminals are connected to the semiconductor substrate or well 33 with which the PMOS transistor 31 is formed and the gate terminal 40 and a PMOS transistor 43 of which source and drain terminals are connected to the semiconductor substrate or well 33 and the substrate voltage terminal 38. Similarly, the select circuit 36 is constituted by a PMOS transistor 44 of which source and drain terminals are connected to the semiconductor substrate or well 34 with which the NMOS transistor 32 is formed and the gate terminal 41 and an NMOS transistor 45 of which source and drain terminals are connected to the semiconductor substrate or well 34 and the substrate voltage terminal 39.

The gate terminals of the NMOS transistor 42 and the PMOS transistor 43 are connected to each other and then to the Selectp signal input terminal 46. The gate terminals of the PMOS transistor 44 and the NMOS transistor 45 are connected to each other and then to the Selectn signal input terminal 47. The select circuits 35, 36 are controlled by one switching signal, Selectp signal or Selectn signal.

In addition, the voltage Vstbp of the substrate voltage terminal 38 is applied to the semiconductor substrate or well with which the PMOS transistor 43 is formed and the voltage Gnd of the ground voltage terminal is applied to the semiconductor substrate or well with which the NMOS transistor 42 is formed. Similarly, the voltage Vdd of the power supply voltage terminal is applied to the semiconductor substrate or well with which the PMOS transistor 44 is formed and the voltage Vstbn of the substrate voltage terminal 39 is applied to the semiconductor substrate or well with which the NMOS transistor 45 is formed. Thus, the voltage of the substrate or well of the PMOS transistors 43, 44 is set to be equal to the voltage of the source terminal or higher and voltage of the substrate or well of the NMOS transistors 42, 45 is set equal to the voltage of the source terminal or lower. Therefore, the absolute values of the threshold voltages of the PMOS transistors 43, 44 and the NMOS transistors 42, 45 are increased and thereby the leakage currents through the PMOS transistors 43, 44 and the NMOS transistor 42, 45 can be suppressed.

In FIG. 4, the voltage Gnd of the ground voltage terminal is applied to the semiconductor substrate or well with which the NMOS transistor 42 is formed and the voltage Vdd of the power supply voltage terminal is applied to the semiconductor substrate or well with which the PMOS transistor 44 is formed. However, if the voltage Vstbn (<Gnd) of the substrate voltage terminal 39 on the select circuit 36 side is applied to the semiconductor substrate or well with which the NMOS transistor 42 is formed while the voltage Vstbp (>Vdd) of the substrate voltage terminal 38 on the select circuit 35 side is applied to the semiconductor substrate or well with which the PMOS transistor 44 is formed, the absolute values of the threshold voltages of the NMOS transistor 42 and the PMOS transistor 44 are increased and thereby the leakage currents through the PMOS transistors 43, 44 and the NMOS transistors 42, 45 can be further suppressed.

In the select circuit 35, the voltage Vin of the input terminal 37 of the CMOS inverter circuit is a voltage in the range between Vdd and Gnd and Vin<Vstbp is satisfied at all times. The PMOS transistor 43 is disposed on the Vstbp (substrate voltage terminal 38) side having a higher voltage out of the voltage Vin of the input terminal 37 and the voltage Vstbp of the substrate voltage terminal 38 while the NMOS transistor 42 is disposed on the Vin (input terminal 37) side having a lower voltage. Therefore, when the voltage of Selectp signal is set to be equal to Vstbp or higher, the PMOS transistor 43 does not conduct while the NMOS transistor 42 conducts. Then, the substrate voltage or well voltage Vsubp of the PMOS transistor 31 can be made equal to the voltage Vin of the gate terminal 40. When the voltage of the Selectp signal is set to be equal to Gnd or lower, the PMOS transistor 43 conducts while the NMOS transistor 42 does not conduct. Then, the substrate voltage or well voltage Vsubp of the PMOS transistor 31 can be made equal to the voltage Vstbp of the substrate voltage terminal 38.

Similarly, in the select circuit 36, Vin>Vstbn is satisfied at all times. Therefore, when the voltage of the Selectn signal is set to be equal to Vstbn or lower or equal to Vdd or higher, the substrate voltage or well voltage Vsubn of the NMOS transistor 32 can be made equal to the voltage Vin of the gate terminal 41 or the voltage Vstbn of the substrate voltage terminal 39.

Here, voltages (Vstbp−Gnd), (Vdd−Vstbn) higher than (Vdd−Gnd) are applied to the PMOS transistor 43 and the NMOS transistor 42 and the PMOS transistor 44 and the NMOS transistor 45 constituting the select circuits 35, 36. Leakage currents of the PMOS transistors 43, 44 and the NMOS transistors 42, 45 can be reduced by setting the absolute values of the threshold voltages of the PMOS transistors 43, 44 and the NMOS transistors 42, 45 to be higher than the absolute values of the threshold voltages of the PMOS transistor 31 and the NMOS transistor 32.

Switching between the Selectp signal to the select circuit 35 and the Selectn signal to the select circuit 36 is performed in response to switching of the CMOS inverter circuit between the active state and the standby state. That is, when the voltage of the Selectp signal is set to be equal to Vstbp or higher and the voltage of the Selectn signal is set to be equal to Vstbn or lower while the CMOS inverter circuit is in the active state, both the voltages of the substrate or well Vsubp, Vsubn become equal to the voltage Vin of the gate terminals 40, 41. Consequently, the on-current of the PMOS transistor 31 or the NMOS transistor 32 turned on becomes $10^{-4}$ A/$\mu$m and the driving current of the CMOS inverter circuit is increased to $10^{-4}$ A/$\mu$m. The off-current of the NMOS transistor 32 or the PMOS transistor 31 turned off becomes $10^{-10}$ A/$\mu$m and thereby the leakage current flowing from the power supply voltage terminal to the ground voltage terminal is reduced to $10^{-10}$ A/$\mu$m.

On the other hand, when the voltage of the Selectp signal is set to be equal to Gnd or lower and the voltage of the Selectn signal is set to be equal to Vdd or higher while the CMOS inverter circuit is in the standby state, the voltage of the substrate or well Vsubp becomes equal to the voltage Vstbp of the substrate voltage terminal 38 while the voltage of the substrate or well Vsubn becomes equal to the voltage Vstbn of the substrate voltage terminal 39. Consequently, the off-current of the PMOS transistor 31 or the NMOS transistor 32 turned off becomes $10^{-12}$ A/$\mu$m and thereby the leakage current flowing from the power supply voltage terminal to the ground voltage terminal is further reduced to $10^{-12}$ A/$\mu$m.

As described above, in the method of operating the CMOS inverter circuit according to the first method, the driving current can be increased to $10^{-4}$ A/$\mu$m and thereby the leakage current can be reduced to $10^{-10}$ A/$\mu$m in the active state while the leakage current in the standby state can be further reduced to $10^{-12}$ A/$\mu$m by setting the voltage of the substrate or well to be a voltage suitable for the active state or standby state.

As a second method of operating the CMOS inverter circuit shown in FIG. 3, described below is a method of connecting either the semiconductor substrate or well 33 with which the PMOS transistor 31 is formed or the semiconductor substrate or well 34 with which the NMOS transistor 32 is formed to the input terminal 37 of the CMOS inverter circuit and switching the other to the substrate voltage terminal 38 or the substrate voltage terminal 39.

Here, the voltage Vstbp of the substrate voltage terminal 38 and the voltage Vstbn of the substrate voltage terminal 39 are set as Vstbp>Vdd>Gnd>Vstbn.

Discussed below is the case where the voltage Vin of the input terminal 37 is equal to the ground voltage Gnd and the semiconductor substrate or well 33 of the PMOS transistor 31 is connected to the gate terminal 40 (the input terminal 37 of the CMOS inverter circuit) and the semiconductor substrate or well 34 of the NMOS transistor 32 is connected to the substrate voltage terminal 39. In this case, since a voltage at which the PMOS transistor 31 is turned on is applied to the semiconductor substrate or well 33 of the PMOS transistor 31, the absolute value of the threshold voltage is equivalently lowered and the on-current is increased to $10^{-4}$ A/$\mu$m. Since Vstbn is applied to the semiconductor substrate or well 34 of the NMOS transistor 32 at the same time, the absolute value of the threshold voltage is increased and the off-current is reduced to $10^{-12}$ A/$\mu$m.

Discussed below is the case where the voltage Vin of the input terminal is equal to the power supply voltage Vdd and the semiconductor substrate or well 33 of the PMOS transistor 31 is connected to the substrate voltage terminal 38 and the semiconductor substrate or well 34 of the NMOS transistor 32 is connected to the gate terminal 41 (the input terminal 37 of the CMOS inverter circuit) on the other hand. In this case, since a voltage at which the NMOS transistor 32 is turned on is applied to the semiconductor substrate or well 34 of the NMOS transistor 32, the absolute value of the threshold voltage is equivalently lowered and the on-current is increased to $10^{-4}$ A/$\mu$m. Since Vstbp is applied to the semiconductor substrate or well 33 of the PMOS transistor 31 at the same time, the absolute value of the threshold voltage is increased and the off-current is reduced to $10^{-12}$ A/$\mu$m.

As described above, the on-current of the PMOS transistor 31 or the NMOS transistor 32 turned on becomes $10^{-4}$ A/$\mu$m and the driving current of the CMOS inverter circuit is increased to $10^{-4}$ A/$\mu$m. On the other hand, the off-current of NMOS transistor 32 or PMOS transistor 31 turned off becomes $10^{-12}$ A/$\mu$m and thereby the leakage current flowing from the power supply voltage terminal to the ground voltage terminal is reduced to $10^{-12}$ A/$\mu$m.

Switching between the Selectp signal to the select circuit 35 and the Selectn signal to the select circuit 36 is performed in response to the change in the gate voltages of the PMOS transistor 31 and the NMOS transistor 32. That is, when the voltage of the Selectp signal is set to be equal to Vstbp or higher and the voltage of the Selectn signal is set equal to Vdd or higher while the voltage Vin of the input terminal 37 is equal to the ground voltage Gnd, the voltage of the substrate or well Vsubp becomes equal to the voltage Vin of the gate terminals 40 while the voltage of the substrate or well Vsubn becomes equal to the voltage Vstbn of the substrate voltage terminal 39. Consequently, the on-current of the PMOS transistor 31 turned on becomes $10^{-4}$ A/$\mu$m and the driving current of the CMOS inverter circuit is increased to $10^{-4}$ A/$\mu$m. The off-current of the NMOS transistor 32 turned off becomes $10^{-12}$ A/$\mu$m and thereby the leakage current flowing from the power supply voltage terminal to the ground voltage terminal is reduced to $10^{-12}$ A/$\mu$m.

On the other hand, when the voltage of the Selectp signal is set to be equal to Gnd or lower and the voltage of the Selectn signal is set equal to be Vstbn or lower while the voltage Vin of the input terminal 37 is equal to the power supply voltage Vdd, the voltage of the substrate or well Vsubp becomes equal to the voltage Vstbp of the substrate voltage terminal 38 while the voltage of the substrate or well Vsubn becomes equal to the voltage Vin of the substrate voltage terminal 41. Consequently, the on-current of the NMOS transistor 32 turned on becomes $10^{-4}$ A/$\mu$m and the driving current of the CMOS inverter circuit is increased to $10^{-4}$ A/$\mu$m. The off-current of the PMOS transistor 31 turned off becomes $10^{-12}$ A/$\mu$m and thereby the leakage current flowing from the power supply voltage terminal to the ground voltage terminal is reduced to $10^{-12}$ A/$\mu$m.

As described above, in the method of operating the CMOS inverter circuit according to the second method, the off-current can be reduced to $10^{-12}$ A/$\mu$m and thereby the leakage current can be reduced to $10^{-12}$ A/$\mu$m regardless of whether the circuit is in the active state or the standby state by setting the voltage of the substrate or well in response to the gate voltage.

Figure 5:
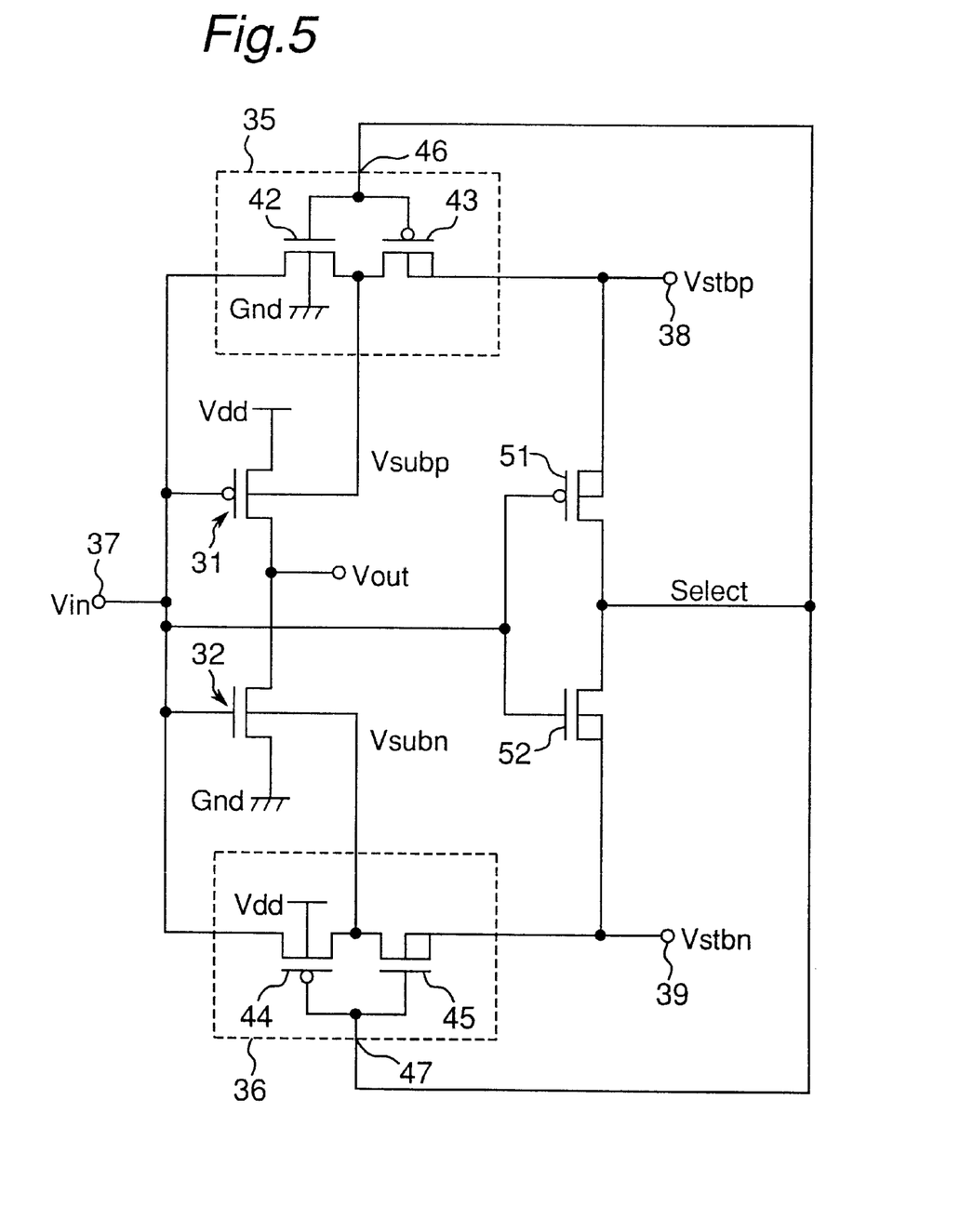
FIG. 5 is a circuit diagram of a circuit generating a Selectp signal and a Selectn signal in FIG. 4.

The Selectp signal and the Selectn signal in the second method described above can be generated by a circuit shown in FIG. 5. In FIG. 5, the Selectp signal input terminal 46 and the Selectn signal input terminal 47 in FIG. 4 are connected so that one signal, a Select signal is input. The Select signal is generated by a PMOS transistor 51 having source and drain terminals connected to the Select signal input terminals 46, 47 and the substrate voltage terminal 38 and a gate terminal connected to the input terminal 37 of the CMOS inverter circuit and an NMOS transistor 52 having source and drain terminals connected to the Select signal input terminals 46, 47 and the substrate voltage terminal 39 and a gate terminal connected to the input terminal 37 of the CMOS inverter circuit.

The voltage Vstbp of the substrate voltage terminal 38 is applied to the semiconductor substrate or well with which the PMOS transistor 51 is formed. Similarly, the voltage Vstbn of the substrate voltage terminal 39 is applied to the semiconductor substrate or well with which the NMOS transistor 52 is formed. Since respective voltages of the substrate or well of the PMOS transistor 51 and the NMOS transistor 52 become equal to the voltage of the source terminal as a result, the absolute values of the threshold voltages of the PMOS transistor 51 and the NMOS transistor 52 are increased and thereby the leakage currents through the PMOS transistor 51 and the NMOS transistor 52 can be suppressed.

Further, the voltages Vstbp, Vstbn of the substrate voltage terminal 38, 39 are set as Vstbp>Vdd>Gnd>Vstbn. The absolute value of the threshold voltage of the PMOS transistor 51 is set to be higher than (Vstbp−Vdd) and lower than (Vstbp−Gnd). The absolute value of the threshold voltage of the NMOS transistor 52 is set to be higher than (Gnd−Vstbn) and lower than (Vdd−Vstbn). Therefore, when the voltage Vin of the input terminal 37 is equal to the power supply voltage Vdd, the PMOS transistor 51 does not conduct and the NMOS transistor 52 conducts. Then, the voltage of the Select signal becomes equal to the voltage Vstbn of the substrate voltage terminal 39. Therefore, in the select circuits 35, 36, the PMOS transistors 43, 44 conduct while the NMOS transistors 42, 45 do not conduct. While the voltage Vstbp is applied as the voltage of the substrate or well Vsubp, the voltage Vin (voltage Vdd) is applied as the voltage of the substrate or well Vsubn. On the other hand, when the voltage Vin of the input terminal 37 is equal to the ground voltage Gnd, the PMOS transistor 51 conducts and the NMOS transistor 52 does not conduct. The voltage of the Select signal becomes equal to the voltage Vstbp of the substrate voltage terminal 38. Therefore, in the select circuits 35, 36, the PMOS transistors 43, 44 do not conduct while the NMOS transistors 42, 45 conduct. The voltage Vin (voltage Gnd) is applied as the voltage of the substrate or well Vsubp while the voltage Vstbn is applied as the voltage of the substrate or well Vsubn.

As described above, the MOS transistor circuit of this embodiment has a select circuit 22 as shown in FIG. 1. Either the gate terminal 23 of the NMOS transistor 21 or the substrate voltage terminal 24 is selected by the Select signal so as to be connected to the semiconductor substrate or well 25 with which NMOS transistor 21 is formed.

Therefore, when the voltage Vstb of the substrate voltage terminal 24 is set to be lower than a gate voltage Vg at which the NMOS transistor 21 is turned off and the substrate voltage terminal 24 is connected to the semiconductor substrate or well 25 in the standby state, the absolute value of the threshold voltage of the NMOS transistor 21 can be increased and thereby the off-current can be reduced to $10^{-12}$ A/$\mu$m. In the active state, the absolute value of the threshold voltage can be reduced and the on-current can be increased to $10^{-4}$ A/$\mu$m in an ON state by connecting the gate terminal 23 to the semiconductor substrate or well 25. On the other hand, the absolute value of the threshold voltage in an OFF state can be increased and thereby the off-current can be reduced to $10^{-10}$ A/$\mu$m.

Or, when the gate voltage Vg is a voltage at which the NMOS transistor 21 is turned on, the semiconductor substrate or well 25 is connected to the gate terminal 23. In the case of a turn-off voltage, the absolute value of the threshold voltage of the NMOS transistor 21 can be lowered and the on-current can be increased to $10^{-4}$ A/$\mu$m in the ON state regardless of whether the circuit is in the active state or the standby state by connecting the substrate or well to the substrate voltage terminal 24. On the other hand, in the OFF state, the absolute value of the threshold voltage can be increased and thereby the off-current can be reduced to $10^{-12}$ A/$\mu$m.

That is, by constituting a semiconductor integrated circuit by using an NMOS transistor circuit having the above-constituted NMOS transistor 21, the select circuit 22 and the substrate voltage terminal 24 or a similar PMOS transistor circuit, leakage currents in the standby state and leakage currents flowing from the power supply voltage terminal to the ground voltage terminal in the active state can be suppressed. Or, leakage currents in the OFF state can be suppressed regardless of whether the circuit is in the active state or the standby state and thereby lower power consumption of the semiconductor integrated circuit can be achieved.

In this case, the select circuit 36 is constituted by a PMOS transistor 44 for connecting the semiconductor substrate or well 34 of the NMOS transistor 32 to the gate terminal 41 and an NMOS transistor 45 for connecting the semiconductor substrate or well 34 to the substrate voltage terminal 39 as shown in FIG. 4. Gate terminals of the PMOS transistor 44 and the NMOS transistor 45 are connected to the Selectn signal input terminal 47. The voltage Vstbn of the substrate voltage terminal 39 is connected to the semiconductor substrate or well of the NMOS transistor 45 while the voltage Vdd of the power supply voltage terminal is connected to the semiconductor substrate or well of the PMOS transistor 44. These voltages are set as Vdd>Gnd>Vstbn. Thus, the NMOS transistor is connected to a substrate voltage terminal 39 having a lower potential and the PMOS transistor is connected to a gate terminal 41 having a higher potential so that there is no voltage increase or voltage drop by the threshold voltages of the MOS transistors 44, 45 constituting the select circuit 36. When the voltage of the Selectn signal is switched to a voltage equal to Vstbn or lower or equal to Vdd or higher, the voltage of the substrate or well of the NMOS transistor 32 can be made equal to the voltage of the gate terminal 41 or the substrate voltage terminal 39.

The voltage of the substrate or well of the PMOS transistor 44 constituting the select circuit 36 is set to be higher than the voltage of the source terminal and the voltage of the substrate or well of the NMOS transistor 45 is set to be equal to the voltage of the source terminal. Therefore, the absolute values of the threshold voltages of both the MOS transistors 44, 45 increase. When the absolute values of the voltages Vdd, Gnd, Vstbn are set so that the absolute values of the threshold voltages of both the MOS transistors are higher than the absolute value of the threshold voltage of the NMOS transistor 32, leakage currents through the MOS transistors 44, 45 can be suppressed to a low level even if a voltage higher than that of the NMOS transistor 32 is applied to the MOS transistors 44, 45.

As shown in FIG. 4, the effect obtained by the NMOS transistor circuit constituted by the NMOS transistor 21 (32), the select circuit 22 (36) and the substrate voltage terminal 24 (39) can also be obtained by a PMOS transistor circuit constituted by the PMOS transistor 31, the select circuit 35 and the substrate voltage terminal 38 where the conductive type of the select circuit 35 is reverse to that of the select circuit 36 and respective voltages are set as Vstbp>Vdd>Gnd.

In the above embodiment, the configuration and operation of the PMOS transistor circuit and the NMOS transistor circuit having the above constitution are described by taking a CMOS inverter circuit as an example. However, CMOS logic circuits other than a CMOS inverter circuit such as a latching circuit, a flip-flop, a flip-flop having a master-stage latching circuit and a slave-stage latching circuit or the like can also be constituted. Further, when power supply is stopped to an operation stopping circuit, a data storage circuit for once storing data of the operation stopping circuit can also be constituted by the aforementioned latching circuit, the flip-flop or the like to suppress leakage currents and thereby lower power consumption can be achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A MOS transistor circuit comprising:
   a substrate voltage terminal;
   an input voltage terminal;
   a MOS transistor having a gate, a drain, a source and a body terminal, wherein said body terminal comprises the semiconductor well and substrate, said gate connected to said input voltage terminal;
   a switch for switching a connection of the body terminal to the gate terminal of the MOS transistor or a substrate voltage terminal, said switch controlled by an input select signal, wherein said switch further comprises:
   an n-type transistor, wherein the body terminal of the n-type transistor is connected to ground and the source is connected to said input voltage terminal; and
   a p-type transistor, wherein the body terminal and source of the p-type transistor are connected to said substrate voltage terminal, the gate terminals of the n-type and p-type transistors mutually connected to said input select signal, and wherein the drain terminals of said p-type and n-type transistors are mutually connected to said body terminal of said MOS transistor.

* * * * *